(12) United States Patent
Lu (10) Patent No.: US 7,391,246 B1
(45) Date of Patent: Jun. 24, 2008

(54) DIGITAL HIGH SPEED PROGRAMMABLE DELAYED LOCKED LOOP

(75) Inventor: Wei Guang Lu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 886 days.

(21) Appl. No.: 10/792,055

(22) Filed: Mar. 2, 2004

(51) Int. Cl.
*H03L 7/00* (2006.01)

(52) U.S. Cl. ........................................ 327/161; 327/153
(58) Field of Classification Search ........................ None
See application file for complete search history.

(56) References Cited

U.S. PATENT DOCUMENTS

| | | | | |
|---|---|---|---|---|
| 4,949,356 | A | * | 8/1990 | Long ........................... 375/332 |
| 6,289,068 | B1 | | 9/2001 | Hassoun et al. |
| 6,400,735 | B1 | | 6/2002 | Percey |
| 6,437,713 | B1 | * | 8/2002 | Lesea ........................... 341/78 |
| 6,759,881 | B2 | * | 7/2004 | Kizer et al. .................. 327/147 |
| 7,253,672 | B2 | * | 8/2007 | Gomm et al. ............... 327/261 |

OTHER PUBLICATIONS

U.S. Appl. No. 10/618,404, filed Jul. 11, 2003, Young.
U.S. Appl. No. 10/683,944, filed Oct. 10, 2003, Young.

* cited by examiner

*Primary Examiner*—Cassandra Cox
(74) *Attorney, Agent, or Firm*—Timothy W. Markison (57) ABSTRACT

A digital high speed programmable delayed locked loop (DLL) includes a zero degree phase shift digital delay line, at least one intermediate phase shift digital delay line, a three hundred and sixty degree phase shift digital delay line, and a digital control module. The zero degree phase shift, intermediate phase shift, and 360 degree phase shift digital delay lines are operably coupled to produce, from a clock signal, zero phase shifted, intermediate phase shifted, and 360 phase shifted representations, respectively, of the clock signal. The digital control module is operably coupled to produce an intermediate control signal for the intermediate phase shift digital delay line and a 360 degree control signal for the 360 degree phase shift digital delay line based on a phase difference between the zero phase shifted representation of the clock signal and the three hundred and sixty degree phase shifted representation of the clock signal.

18 Claims, 5 Drawing Sheets digital clock manager

FIG. 1

FIG. 2
digital clock manager

FIG. 3
digital clock manager

FIG. 4

FIG. 5
digital clock manager

DIGITAL HIGH SPEED PROGRAMMABLE DELAYED LOCKED LOOP

BACKGROUND OF THE INVENTION

1. Technical Field of the Invention

This invention relates generally to integrated circuits and more particularly to integrated delayed locked loops.

2. Description of Related Art

As is known, delayed locked loops (DLL) are used for clock deskewing, i.e., taking a clock signal and producing multiple phased representations of the clock signal. For example, a DLL may produce a 90 degree phase shifted representation of the clock, a 180 degree phase shifted representation of the clock, and a 270 degree phase shifted representation of the clock.

As is also known, a DLL may be implemented in a variety of ways. For instance, a fully digital DLL that produces a ninety degree phase shifted representation of a clock signal, a one hundred and eighty degree phase shifted representation of the clock, and a two hundred and seventy degree phase shifted representation of the clock includes four cascaded digital delay lines and a phase detection module. The first digital delay line receives, as its input, the input clock signal and, based on a control signal, produces the ninety degree phase shifted representation of the clock signal. The second digital delay line receives, as its input, the ninety degree phase shifted representation of the clock signal and, based on the control signal, produces the one hundred and eighty degree phase shifted representation of the clock signal. The third digital delay line receives, as its input, the one hundred and eighty degree phase shifted representation of the clock signal and, based on the control signal, produces the two hundred and seventy degree phase shifted representation of the clock signal. The fourth digital delay line receives, as its input, the two hundred and seventy degree phase shifted representation of the clock signal and, based on the control signal, produces a three hundred and sixty degree phase shifted representation of the clock signal.

The control module produces the control signal by comparing the input clock signal with the three hundred and sixty degree phase shifted representation of the clock signal. In general, the control module produces the control signal such that the three hundred and sixty degree phase shifted representation of the clock signal looks exactly like the input clock signal, but shifted by one period of the input clock cycle.

To provide an accurate and flexible DLL, each digital delay line includes a plurality of buffers that have their data transition rates controlled to produce a plurality of delayed representations of the respective input clock signal. The DLL further includes a multiplexer coupled to output one of the plurality of delayed representations of the respective input clock signal as the respective phase shifted output clock signal.

Due to the amount of circuitry required to implement each digital delay line and having four digital delay lines cascaded together, there is a finite limit as to the rate of clock signals it can deskew. For instance, if each digital delay line includes 128 taps and the DLL is implemented using 0.13 micron CMOS (Complimentary Metal Oxide Semiconductor) technology, the maximum rate of the input clock is about 500 MHz (mega Hertz).

Therefore, a need exists for a digital high speed (e.g., greater than 500 MHz) programmable delayed locked loop (DLL).

BRIEF SUMMARY OF THE INVENTION

The digital high speed programmable delayed locked loop (DLL) of the present invention substantially meets these needs and others. In one embodiment, a digital high speed programmable delayed locked loop (DLL) includes a zero degree phase shift digital delay line, at least one intermediate phase shift digital delay line, a three hundred and sixty degree phase shift digital delay line, and a digital control module. The zero degree phase shift digital delay line is operably coupled to produce, from a clock signal, a zero phase shifted representation of the clock signal. The at least one intermediate phase shift digital delay line is operably coupled to produce, from a clock signal, an intermediate phase shifted representation of the clock signal based on an intermediate control signal. The three hundred and sixty degree phase shift digital delay line is operably coupled to produce, from a clock signal, a three hundred and sixty degree phase shifted representation of the clock signal based on a three hundred and sixty degree control signal. The digital control module is operably coupled to produce the intermediate control signal and the three hundred and sixty degree control signal based a phase difference between the zero phase shifted representation of the clock signal and the three hundred and sixty degree phase shifted representation of the clock signal.

In another embodiment, a digital high speed programmable delayed locked loop includes a zero degree phase shift digital delay line, a first multiplexer, at least one intermediate phase shift digital delay line, a second multiplexer, a three hundred and sixty degree phase shift digital delay line, and a digital control module. The zero degree phase shift digital delay line is operably coupled to produce, from a clock signal, a zero phase shifted representation of the clock signal. The first multiplexer is operably coupled to output the zero phase shifted representation of the clock signal or the clock signal based on a mode of operation control signal to produce a first selected clock signal. The at least one intermediate phase shift digital delay line is operably coupled to produce an intermediate phase shifted representation of the first selected clock signal based on an intermediate control signal. The second multiplexer is operably coupled to output the intermediate phase shifted representation of the clock signal or the clock signal based on the mode of operation control signal to produce a second selected clock signal. The three hundred and sixty degree phase shift digital delay line is operably coupled to produce a three hundred and sixty degree phase shifted representation of the second selected clock signal based on a three hundred and sixty degree control signal. The digital control module is operably coupled to produce the intermediate control signal and the three hundred and sixty degree control signal based a phase difference between the zero phase shifted representation of the clock signal and the three hundred and sixty degree phase shifted representation of the clock signal.

DETAILED DESCRIPTION OF THE INVENTION

Figure 1:
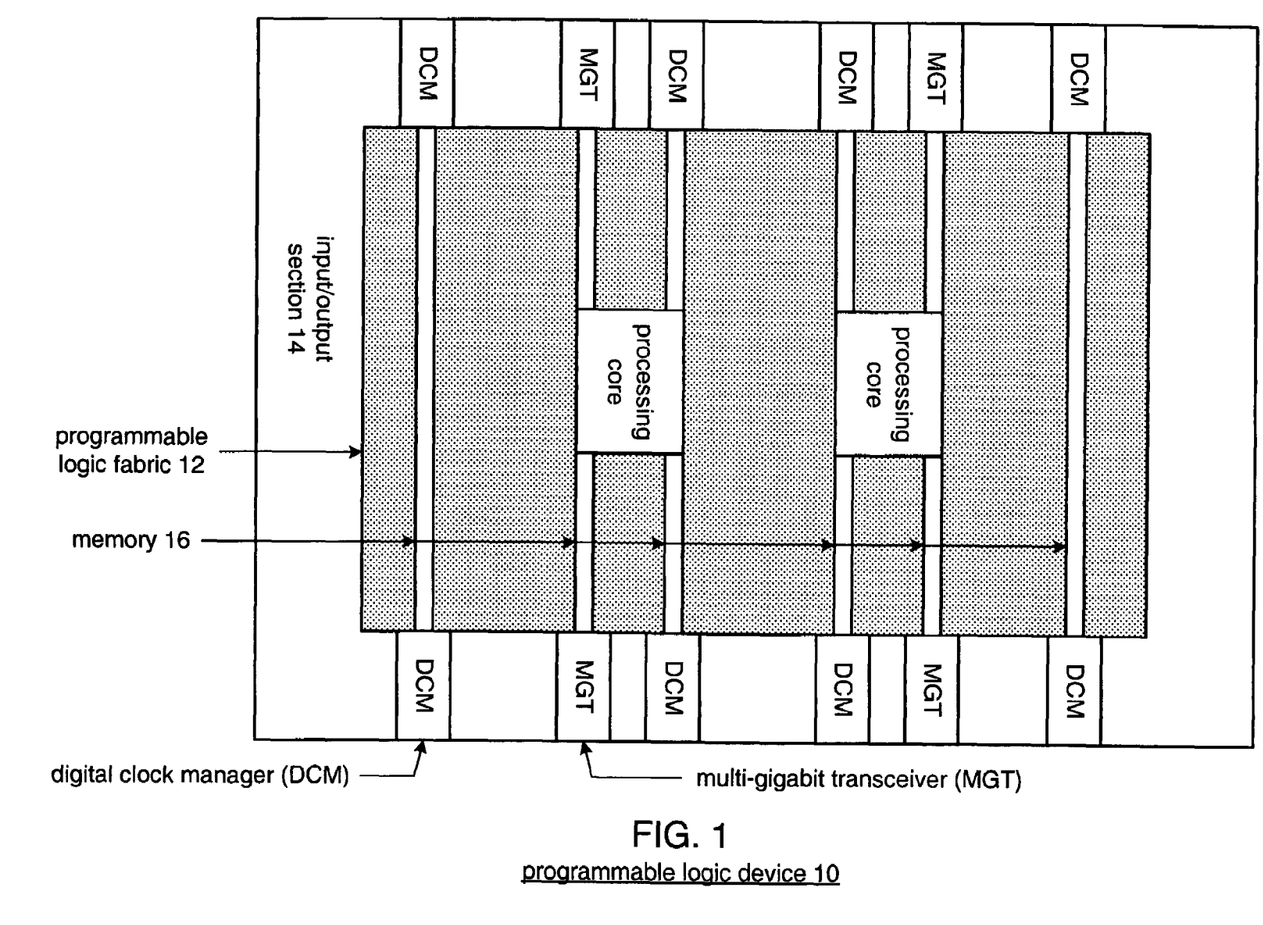
FIG. 1 is a schematic block diagram of a programmable logic device in accordance with the present invention.

FIG. 1 is a schematic block diagram of a programmable logic device 10 that includes programmable logic fabric 12, an input/output section 14, and memory 16. The programmable logic fabric 12 may include one or more processing cores and programmable logic circuitry. Such programmable logic circuitry may include programmable logic arrays (PLA), programmable array logic (PAL) devices, erasable programmable logic devices (EPLD) and/or programmable gate arrays (PGA). The memory 16 may be block random access memory (BRAM). The input/output section 14 may include a plurality of digital clock managers (DCM) and a plurality of multi-gigabit transceivers (MGT).

In an another embodiment of the present invention, the FPGA has a columnar architecture as described in co-pending U.S. patent applications "Columnar Floorplan", by Steven P. Young, application Ser. No. 10/618,404 filed Jul. 11, 2003 and "Columnar Architecture", by Steven P. Young, application Ser. No. 10/683,944 filed Oct. 10, 2003, both of which are herein incorporated by reference in their entirety.

The digital clock managers (DCM) provide various clock signals to the programmable logic fabric 12 and may further provide clock signals to the multi-gigabit transceivers. The multi-gigabit transceivers provide digital interfaces for the programmable logic fabric 12 to exchange data with components external to the programmable logic device 10. In general, the multi-gigabit transceivers provide serial to parallel conversion of received serial data and provide parallel to serial conversions for outgoing data. Further, the DCM may provide clock signals to memory, or other input/output modules, for double data rate and quad data rate accesses.

Figure 2:
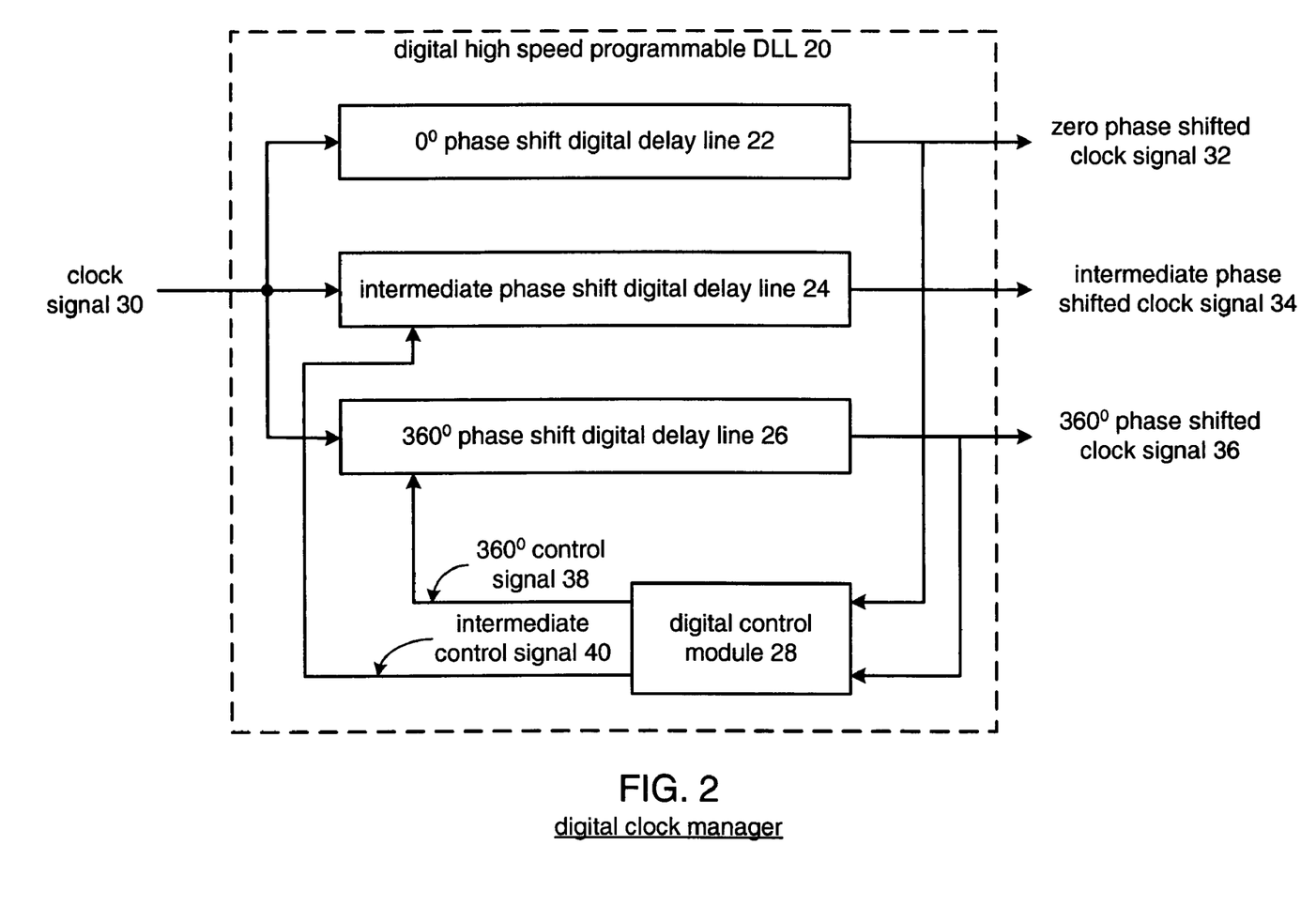
FIG. 2 is a schematic block diagram of an embodiment of a digital high speed programmable delayed locked loop in accordance with the present invention.
Figure 3:
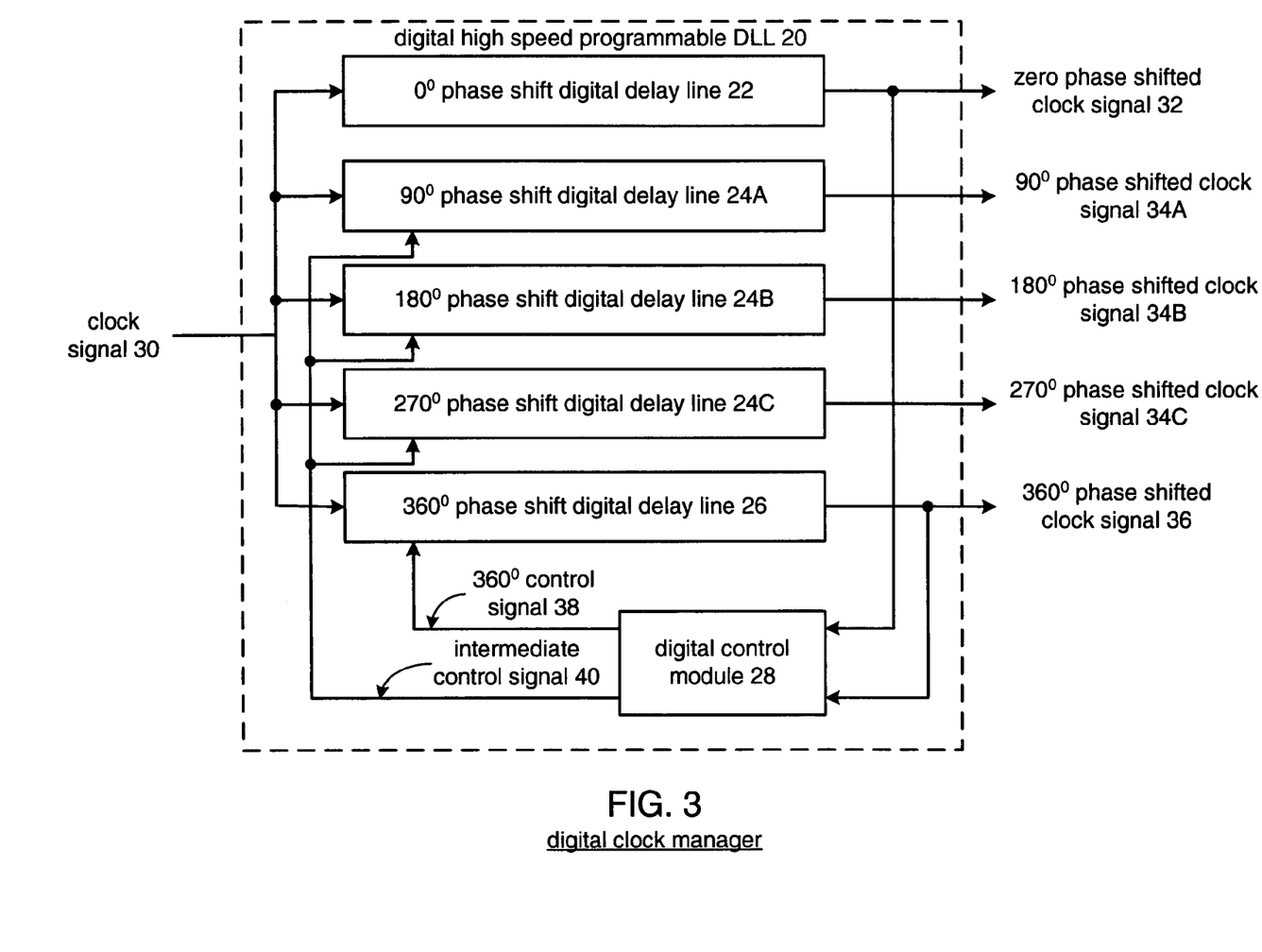
FIG. 3 is a schematic block diagram of another embodiment of a digital high speed programmable delayed locked loop in accordance with the present invention.

FIG. 2 is a schematic block diagram of a digital clock manager (DCM) that is implemented as a digital high-speed programmable delayed locked loop (DLL) 20. The digital high-speed programmable DLL includes a 0° phase shift digital delay line 22, an intermediate phase shift digital delay line 24, a 360° phase shift digital delay line 26 and a digital control module 28. Note that the intermediate phase shift digital delay line 24 may be a single digital delay line operably coupled to produce a 180° phase shifted representation of clock signal 30. Alternatively, the intermediate phase shift digital delay line 24 may include a plurality of intermediate digital delay lines to produce various phase shifted representations of clock signal 30. For example, the digital high-speed programmable DLL 20 may include 3 intermediate phase shift digital delay lines 24 as illustrated in FIG. 3.

Returning to the discussion of FIG. 2, each of the digital delay lines 22-26 receive, as its input, clock signal 30. The 0° phase shift digital delay line 22 produces a 0 phase shifted clock signal 32 from the clock signal 30. In other words, the 0 phase shifted clock signal 32 is the clock signal 30 delayed by the propagation of the circuitry within the digital delay line 22.

The intermediate phase shift digital delay line 24 produces an intermediate phase shifted clock signal 34 from the clock signal 30 and from an intermediate control signal 40. The 360° phase shift digital delay line 26 produces a 360° phase shifted clock signal 36 from clock signal 30 based on a 360° control signal 38.

The digital control module 28 determines a phase difference between the 0 phase shifted clock signal 32 and the 360° phase shifted clock signal 36 to produce the intermediate control signal 40 and the 360° control signal 38. The objective of the control signals 38 and 40 is to maintain a desired phase relationship between the resulting clock signals 32, 34 and 36. As one of average skill in the art will appreciate, in one embodiment, the digital control module 28 may produce a single control signal that is provided to both the intermediate phase shifted digital delay line 24 and the 360° phase shift digital delay line 26. By having each digital delay line 22-24 producing its corresponding phase shifted clock output signal directly from the input clock signal 30, as opposed to cascading the digital delay lines, the rate of the input clock signal 30 may be increased into the gigahertz range.

FIG. 3 is a schematic block diagram of the digital clock manager implemented as a digital high-speed programmable DLL 20 that includes the 0 phase shift digital delay line 22, a 90° phase shift digital delay line 24A, 180° phase shift digital delay line 24B, a 270° phase shift digital delay line 24C, a 360° phase shift digital delay line 26 and the digital control module 28. In this embodiment, the 90° phase shift digital delay line 24A produces a 90° phase shifted clock signal 34A from the clock signal 30 based on the intermediate control signal 40. Similarly, the 180° phase shift digital delay line 24B produces 180° phase shifted clock signal 34B from clock signal 30 based on the intermediate control signal 40. Also, the 270° phase shifted digital delay line 24C produces a 270° phase shifted clock signal 34C from the clock signal 30 based on the intermediate control signal 40. The digital control module 28 produces the 360° control signal and/or the intermediate control signal 40 as previously described with reference to FIG. 2.

With each of the intermediate phase shift digital delay lines 24A, 24B and 24C generating their corresponding phase shifted output clocks directly from the input clock signal 30, the rate of the input clock 30 may be increased into the gigahertz range.

Figure 4:
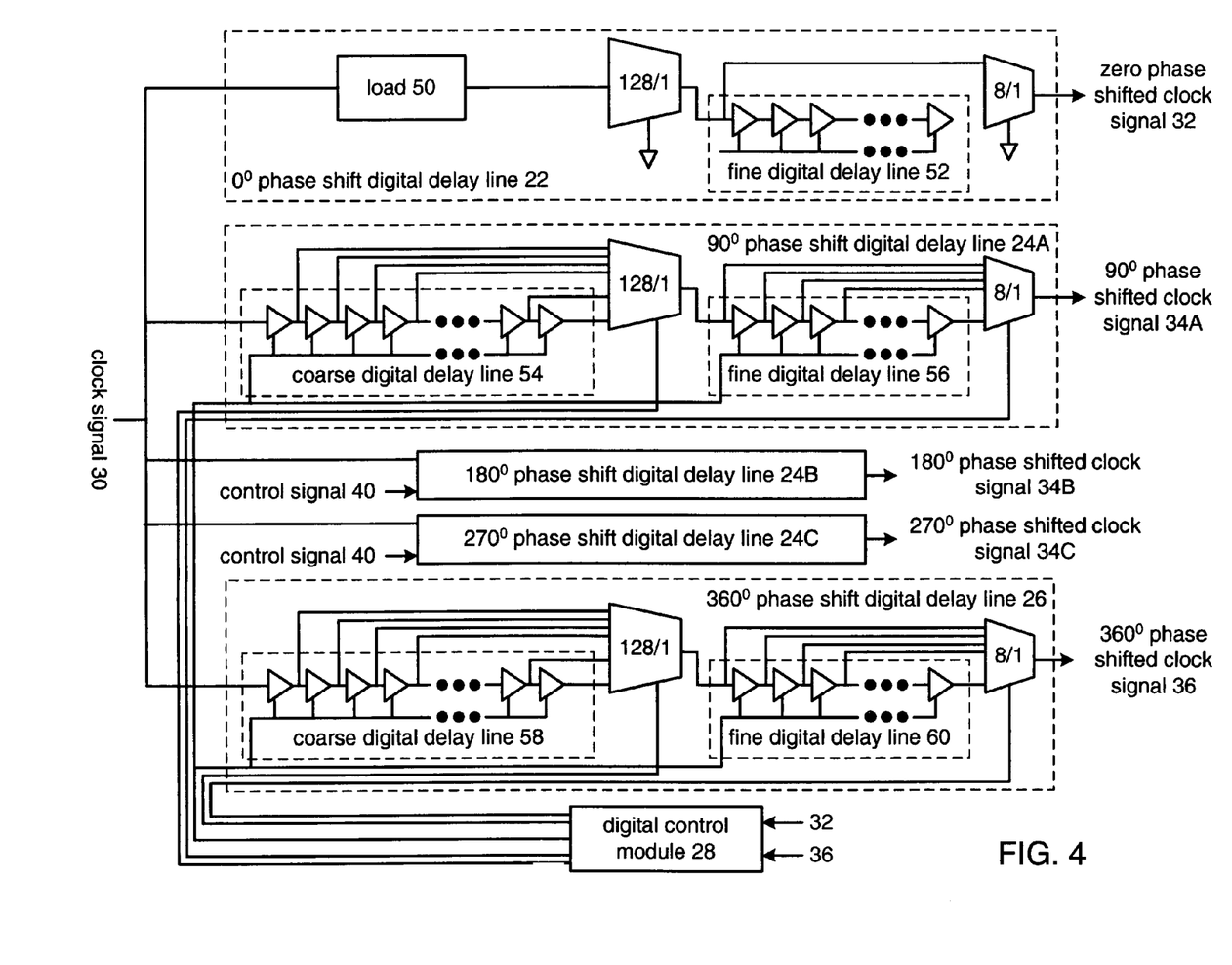
FIG. 4 is a schematic block diagram of yet another embodiment of a digital high speed programmable delayed locked loop in accordance with the present invention.

FIG. 4 is a detailed schematic block diagram of a digital high-speed programmable digital delay locked loop (DLL) 20 that includes the 0 phase shift digital delay line 22, the 90° phase shift digital delay line 24A, the 180° phase shift digital delay line 24B, the 270° phase shift digital delay line 24C, the 360° phase shift digital delay line 26, and the digital control module 28. Each of the intermediate phase shift digital delay lines 24A-24C have similar construct as illustrated with respect to the 90° phase shift digital delay line 24A.

The 0° phase shift digital delay line 22 includes a load 50, a coarse multiplexer (128/1), a fine digital delay line 52, and a fine multiplexer (8/1). The load 50 provides an input impedance that substantially matches the input impedance of the 90° phase shifted digital delay line 24 and the 360° phase shifted digital delay line 26. The coarse multiplexer is coupled to provide the clock signal 30 directly to the fine digital delay line 52 which again is tuned to pass the 0° phase shifted representation of clock signal 30 to the fine multiplexer. The fine multiplexer also outputs the 0° phase shifted representation of clock 30 to produce the 0 phase shifted clock signal 32. In one embodiment the fine digital delay line 52 includes 8 fine taps. The components in the 0° phase shifted digital delay line 22 are included to mimic the propagation delays and loading that the other digital delay lines provide in producing their corresponding phase shifted output clocks.

The 90° phase shift digital delay line 24A includes a coarse digital delay line 54, a coarse multiplexer (128/1), a fine digital delay line 56 and a fine multiplexer (8/1). The coarse digital delay line 54 includes a plurality of buffers that are tapped and serve as inputs to the coarse multiplexer. The number of taps may range from 16 to 256. In one embodiment, the coarse digital delay line 54 includes 128 taps. The rate at which the buffers operate is controlled via a control signal produced by the digital control module 28. Accordingly, based on the phase relationship between the 0 phase shifted clock signal 32 and the 360° phase shifted clock signal 36, the digital control module 28 may set the propagation delays of the coarse digital delay line 54. In addition, based on the phase representation between the 0 phase shifted clock signal 32 and 360° phase shifted clock signal 36, the digital control module 28 generates a control signal that is provided to the coarse multiplexer which selects one of the taps of the coarse digital delay line 54 as its output.

The fine digital delay line 56 receives the output of the coarse multiplexer and produces a plurality of delayed representations thereof. The fine multiplexer, based on the control signal produced by the digital control module 28, outputs the 90° phase shifted clock signal 34A.

The 360° phase shift digital delay line 26 includes a coarse digital delay line 58, a coarse multiplexer (128/1), a fine digital delay line 60, and a fine multiplexer (8/1). The functionality of the coarse digital delay line 58, coarse multiplexer, fine digital delay line 60 and fine multiplexer are similar to the operations of the corresponding elements in the 90° phase shifted digital delay line 24A.

Figure 5:
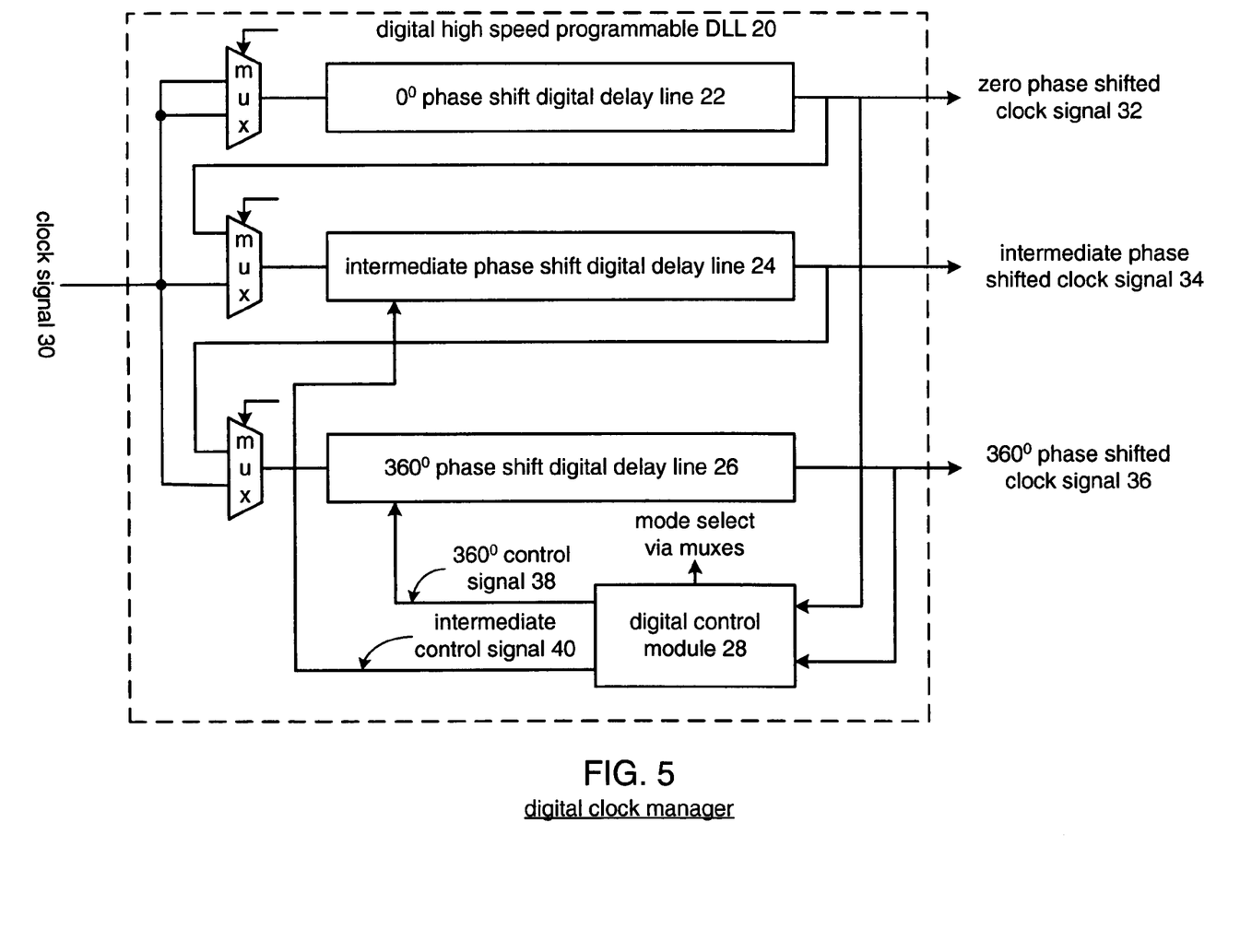
FIG. 5 is a schematic block diagram of a further embodiment of a digital high speed programmable delayed locked loop in accordance with the present invention.

FIG. 5 is a schematic block diagram of another embodiment of the digital high-speed programmable DLL 20 that includes a plurality of multiplexers (MUX), the 0° phase shifted digital delay line 22, the intermediate phase shift digital delay line 24, the 360° phase shift digital delay line 26 and the digital control module 28. The multiplexers, which are controlled via the digital control module may be set such that the digital high-speed programmable DLL operates as previously described with reference to FIG. 2 such that each of the digital delay lines 22-26 generate their corresponding phase shifted clock signals directly from the clock signal 30.

In an alternative implementation, the digital control module 26 may enable the multiplexers such that the input for the intermediate phase shifted digital delay line 24 is the output of the 0 phase shifted digital delay line 22. Further, the input for the 360° phase shift digital delay line 26 may be the output of the intermediate phase shift digital delay line 24. Such a configuration provides legacy compatibility with previous implementations of programmable logic devices.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a digital high-speed programmable delayed locked loop that may have the input clock adjusted and the deskewing of the clock adjusted to produce the desired phase shifted representations of the clock signal. In addition, by having each phase shifted output clock signal being directly generated from the input clock signal, the rate of the input clock signal may be in the gigahertz range or above. As one of average skill in the art will appreciate, other embodiments may be derived from the teaching of the present invention without deviating from the scope of the claims.

What is claimed is:

1. A digital high speed programmable delayed locked loop (DLL) comprises:
   a zero degree phase shift digital delay line operably coupled to produce, from a clock signal, a zero phase shifted representation of the clock signal;
   a plurality of intermediate phase shift digital delay lines, comprising:
      a ninety degree phase-shift digital delay line operably coupled to produce, from the clock signal, a ninety degree phase-shifted representation of the clock signal based on an intermediate control signal;
      a one hundred and eighty degree phase-shift digital delay line operably coupled to produce, from the clock signal, a one hundred and eighty degree phase-shifted representation of the clock signal based on the intermediate control signal; and
      a two hundred and seventy degree phase-shift digital delay line operably coupled to produce, from the clock signal, a two hundred and seventy degree phase-shifted representation of the clock signal based on the intermediate control signal, wherein the two hundred and seventy degree phase-shifted representation of the clock signal corresponds to the intermediate phase-shifted representation of the clock signal;
   a three hundred and sixty degree phase shift digital delay line operably coupled to produce, from the clock signal, a three hundred and sixty degree phase shifted representation of the clock signal based on a three hundred and sixty degree control signal; and
   digital control module operably coupled to produce the intermediate control signal and the three hundred and sixty degree control signal based a phase difference between the zero phase shifted representation of the clock signal and the three hundred and sixty degree phase shifted representation of the clock signal.

2. The digital high speed programmable DLL of claim 1, wherein the zero phase shift digital delay line comprises:
   an input impedance that substantially matches an input impedance of the at least one intermediate phase shift digital delay line and of the three hundred and sixty degree phase shift digital delay line.

3. The digital high speed programmable DLL of claim 1, wherein each of the at least one intermediate phase shift digital delay line comprises:
   a coarse digital delay line having a plurality of taps to provide a plurality of phase shifted representations of the clock signal;
   a coarse multiplexer module operably coupled to output one of the plurality of phase shifted representations of the clock signal based on the intermediate control signal to produce a selected phase shifted representation of the clock signal;

fine digital delay line having a plurality of fine taps to provide a plurality of phase shifted representations of the selected phase shifted representation of the clock signal; and a fine multiplexer module operably coupled to output one of the plurality of phase shifted representations of the selected phase shifted representation based on the intermediate control signal to produce the intermediate phase shifted representation of the clock signal.

4. The digital high speed programmable DLL of claim 1, wherein the three hundred and sixty degree phase shift digital delay line comprises:

a coarse digital delay line having a plurality of taps to provide a plurality of phase shifted representations of the clock signal;

a coarse multiplexer module operably coupled to output one of the plurality of phase shifted representations of the clock signal based on the three hundred and sixty degree control signal to produce a selected phase shifted representation of the clock signal;

fine digital delay line having a plurality of fine taps to provide a plurality of phase shifted representations of the selected phase shifted representation of the clock signal; and a fine multiplexer module operably coupled to output one of the plurality of phase shifted representations of the selected phase shifted representation based on the three hundred and sixty degree control signal to produce the three hundred and sixty degree phase shifted representation of the clock signal.

5. The digital high speed programmable DLL of claim 1, wherein the zero degree phase shift digital delay line comprises:

fine digital delay line having a plurality of fine taps to provide a plurality of phase shifted representations of the zero phase shifted representation of the clock signal, wherein the plurality of phase shifted representations of the zero phase shifted representation of the clock signal includes the zero phase shifted representation of the clock signal;

a coarse multiplexer module operably coupled to the input of the fine digital delay line and enabled to output the zero phase shifted representation of the clock signal; and a fine multiplexer module operably coupled to receive the plurality of the phase shifted representations of the zero phase shifted representation of the clock signal and to output the zero phase shifted representation of the clock signal.

6. A digital high speed programmable delayed locked loop (DLL) comprises:

a zero degree phase shift digital delay line operably coupled to produce, from a clock signal, a zero phase shifted representation of the clock signal;

a first multiplexer operably coupled to output the zero phase shifted representation of the clock signal or the clock signal based on a mode of operation control signal to produce a first selected clock signal;

at least one intermediate phase shift digital delay line operably coupled to produce an intermediate phase shifted representation of the first selected clock signal based on an intermediate control signal;

a second multiplexer operably coupled to output the intermediate phase shifted representation of the clock signal or the clock signal based on the mode of operation control signal to produce a second selected clock signal;

a three hundred and sixty degree phase shift digital delay line operably coupled to produce three hundred and sixty degree phase shifted representation of the second selected clock signal based on a three hundred and sixty degree control signal; and digital control module operably coupled to produce the intermediate control signal and the three hundred and sixty degree control signal based a phase difference between the zero phase shifted representation of the clock signal and the three hundred and sixty degree phase shifted representation of the clock signal.

7. The digital high speed programmable DLL of claim 6, wherein the at least one intermediate phase shift digital delay line comprises:

a plurality of intermediate phase shift digital delay lines.

8. The digital high speed programmable DLL of claim 7, wherein the plurality of intermediate phase shift digital delay lines comprises:

a ninety degree phase shift digital delay line operably coupled to produce a ninety degree phase shifted representation of the first selected clock signal based on the intermediate control signal;

a third multiplexer operably coupled to output the ninety degree phase shifted representation of the first selected clock signal or the clock signal based on the mode of operation control signal to produce a third selected clock signal;

a one hundred and eighty degree phase shift digital delay line operably coupled to produce a one hundred and eighty degree phase shifted representation of the third selected clock signal based on the intermediate control signal;

a fourth multiplexer operably coupled to output the one hundred and eighty degree phase shifted representation of the third selected clock signal or the clock signal based on the mode of operation control signal to produce a fourth selected clock signal; and a two hundred and seventy degree phase shift digital delay line operably coupled to produce a two hundred and seventy degree phase shifted representation of the fourth selected clock signal based on the intermediate control signal, wherein the two hundred and seventy degree phase shifted representation of the fourth selected clock signal corresponds to the intermediate phase shifted representation of the first selected clock signal.

9. The digital high speed programmable DLL of claim 6, wherein the zero phase shift digital delay line comprises:

an input impedance that substantially matches an input impedance of the at least one intermediate phase shift digital delay line and of the three hundred and sixty degree phase shift digital delay line.

10. The digital high speed programmable DLL of claim 6, wherein each of the at least one intermediate phase shift digital delay line comprises:

a coarse digital delay line having a plurality of taps to provide a plurality of phase shifted representations of the first selected clock signal;

a coarse multiplexer module operably coupled to output one of the plurality of phase shifted representations of the first selected clock signal based on the intermediate control signal to produce a selected phase shifted representation of the first selected clock signal;

fine digital delay line having a plurality of fine taps to provide a plurality of phase shifted representations of the selected phase shifted representation of the first selected clock signal; and a fine multiplexer module operably coupled to output one of the plurality of phase shifted representations of the selected phase shifted representation based on the intermediate control signal to produce the intermediate phase shifted representation of the first selected clock signal.

11. The digital high speed programmable DLL of claim 6, wherein the three hundred and sixty degree phase shift digital delay line comprises:

a coarse digital delay line having a plurality of taps to provide a plurality of phase shifted representations of the second selected clock signal;

a coarse multiplexer module operably coupled to output one of the plurality of phase shifted representations of the second selected clock signal based on the three hundred and sixty degree control signal to produce a selected phase shifted representation of the second selected clock signal;

fine digital delay line having a plurality of fine taps to provide a plurality of phase shifted representations of the selected phase shifted representation of the second selected clock signal; and a fine multiplexer module operably coupled to output one of the plurality of phase shifted representations of the selected phase shifted representation based on the three hundred and sixty degree control signal to produce the three hundred and sixty degree phase shifted representation of the second selected clock signal.

12. The digital high speed programmable DLL of claim 6, wherein the zero degree phase shift digital delay line comprises:

a coarse multiplexer module operably coupled to output the zero phase shifted representation of the clock signal;

fine digital delay line having a plurality of fine taps to provide a plurality of phase shifted representations of the zero phase shifted representation of the clock signal, wherein the plurality of phase shifted representations of the zero phase shifted representation of the clock signal includes the zero phase shifted representation of the clock signal; and a fine multiplexer module operably coupled to receive the plurality of the phase shifted representations of the zero phase shifted representation of the clock signal and to output the zero phase shifted representation of the clock signal.

13. A programmable logic device comprises:

an input/output section that includes a digital clock management module;

memory operably coupled to the input/output section; and programmable logic fabric operably coupled to the memory and the input/output section, wherein the digital clock management module includes a digital high speed programmable delayed locked loop (DLL) that includes:

a zero degree phase shift digital delay line operably coupled to produce, from a clock signal, a zero phase shifted representation of the clock signal;

a plurality of intermediate phase shift digital delay lines, comprising:

a ninety degree phase-shift digital delay line operably coupled to produce, from the clock signal, a ninety degree phase-shifted representation of the clock signal based on the intermediate control signal;

a one hundred and eighty degree phase-shift digital delay line operably coupled to produce, from the clock signal, a one hundred and eighty degree phase-shifted representation of the clock signal based on the intermediate control signal;

a two hundred and seventy degree phase-shift digital delay line operably coupled to produce, from the clock signal, a two hundred and seventy degree phase-shifted representation of the clock signal based on the intermediate control signal, wherein the two hundred and seventy degree phase-shifted representation of the clock signal corresponds to the intermediate phase shifted representation of the clock signal;

a three hundred and sixty degree phase shift digital delay line operably coupled to produce, from the clock signal, a three hundred and sixty degree phase shifted representation of the clock signal based on a three hundred and sixty degree control signal; and digital control module operably coupled to produce the intermediate control signal and the three hundred and sixty degree control signal based a phase difference between the zero phase shifted representation of the clock signal and the three hundred and sixty degree phase shifted representation of the clock signal.

14. The programmable logic devices of claim 13, wherein the zero phase shift digital delay line comprises:

an input impedance that substantially matches an input impedance of the three hundred and sixty degree phase shift digital delay line.

15. The programmable logic devices of claim 13, wherein each intermediate phase shift digital delay line of the plurality of intermediate phase shift digital delay lines comprises:

a coarse digital delay line having a plurality of taps to provide a plurality of phase shifted representations of the clock signal;

a coarse multiplexer module operably coupled to output one of the plurality of phase shifted representations of the clock signal based on the intermediate control signal to produce a selected phase shifted representation of the clock signal;

fine digital delay line having a plurality of fine taps to provide a plurality of phase shifted representations of the selected phase shifted representation of the clock signal; and a fine multiplexer module operably coupled to output one of the plurality of phase shifted representations of the selected phase shifted representation based on the intermediate control signal to produce the intermediate phase shifted representation of the clock signal.

16. The programmable logic devices of claim 13, wherein the three hundred and sixty degree phase shift digital delay line comprises:

a coarse digital delay line having a plurality of taps to provide a plurality of phase shifted representations of the clock signal;

a coarse multiplexer module operably coupled to output one of the plurality of phase shifted representations of the clock signal based on the three hundred and sixty degree control signal to produce a selected phase shifted representation of the clock signal;

fine digital delay line having a plurality of fine taps to provide a plurality of phase shifted representations of the selected phase shifted representation of the clock signal; and a fine multiplexer module operably coupled to output one of the plurality of phase shifted representations of the selected phase shifted representation based on the three hundred and sixty degree control signal to produce the three hundred and sixty degree phase shifted representation of the clock signal.

17. The programmable logic devices of claim 13, wherein the zero degree phase shift digital delay line comprises:

fine digital delay line having a plurality of fine taps to provide a plurality of phase shifted representations of the zero phase shifted representation of the clock signal, wherein the plurality of phase shifted representations of the zero phase shifted representation of the clock signal includes the zero phase shifted representation of the clock signal;

a coarse multiplexer module operably coupled to the input of the fine digital delay line and enabled to output the zero phase shifted representation of the clock signal; and a fine multiplexer module operably coupled to receive the plurality of the phase shifted representations of the zero phase shifted representation of the clock signal and to output the zero phase shifted representation of the clock signal.

18. The programmable logic devices of claim 13, wherein the digital high speed programmable DLL further comprises:

a plurality of multiplexers operably coupled to configure the zero degree phase shift digital delay line, the at least one intermediate phase shift digital delay line, and the three hundred and sixty degree phase shift digital delay line in parallel manner for high speed operations and in a serial manner for lower speed operations.

\* \* \* \* \*